US007825714B1

(12) United States Patent
Groe et al.

(10) Patent No.: US 7,825,714 B1
(45) Date of Patent: Nov. 2, 2010

(54) OFFSET NULLING FOR DECREASING OFFSET BETWEEN CURRENTS IN A DIFFERENTIAL SIGNALING SYSTEM

(75) Inventors: John B. Groe, Poway, CA (US); Michael Naone Farias, San Diego, CA (US); Babak Nejati, San Diego, CA (US); Marc Facchini, San Diego, CA (US); Thomas Hardin, Encinitas, CA (US)

(73) Assignee: Quintic Holdings, Santa Clara, CA (US)

( * ) Notice: Subject to any disclaimer, the term of this patent is extended or adjusted under 35 U.S.C. 154(b) by 0 days.

(21) Appl. No.: 12/137,984

(22) Filed: Jun. 12, 2008

Related U.S. Application Data

(60) Provisional application No. 60/943,483, filed on Jun. 12, 2007.

(51) Int. Cl.
*H03L 5/00* (2006.01)
(52) U.S. Cl. ............ 327/307; 327/563; 330/253
(58) Field of Classification Search ............ 327/307, 327/563; 330/253
See application file for complete search history.

(56) References Cited

U.S. PATENT DOCUMENTS

| 5,471,665 | A  | * | 11/1995 | Pace et al. ............ 455/343.2 |
| 6,531,907 | B2 | * | 3/2003  | Dooley et al. ............ 327/307 |
| 6,583,660 | B2 | * | 6/2003  | Blon et al. ............ 327/307 |
| 6,674,328 | B2 | * | 1/2004  | Uto et al. ............ 330/259 |
| 7,009,541 | B1 | * | 3/2006  | Nguyen ............ 341/143 |
| 7,193,466 | B2 | * | 3/2007  | Kim et al. ............ 330/258 |
| 7,193,467 | B2 | * | 3/2007  | Garlepp et al. ............ 330/259 |

* cited by examiner

*Primary Examiner*—Kenneth B. Wells
(74) *Attorney, Agent, or Firm*—Blairtech Solution LLC

(57) ABSTRACT

Systems and methods for nulling offsets in differential signaling systems are described. A first circuit may be configured to sense the difference between a first differential current and a second differential current and provide a sense signal to an adjustment circuit. The adjustment circuit may be configured to generate a correction signal based on the sense signal, where the correction signal is combined with the first differential current to reduce the offset between the first differential current and the second differential current. Alternately, the correction signal may be combined with the first and second differential currents to reduce the offset. The process may be repeated until the corrected first differential current and the second differential current are within a desired tolerance.

8 Claims, 6 Drawing Sheets

An Embodiment of a Nulling Circuit to Set Two Differential Currents Equal

Effects of Offset on Output Spectrum in a I/Q Upconverting Mixer

Effects of Offset on Output Spectrum in an Amplitude Modulator

Signal Feedthru as a Function of Offset in an IQ Upconverting Mixer

Signal Feedthru as a Function of Offset in an Amplitude Modulator

An Embodiment of a Nulling Circuit to Set Two
Differential Currents Equal

An Embodiment of a Successive Approximation
Algorithm for a Nulling Circuit

An Embodiment of a Nulling Circuit Using Digital
Methods to Set Two Differential Currents Equal

OFFSET NULLING FOR DECREASING OFFSET BETWEEN CURRENTS IN A DIFFERENTIAL SIGNALING SYSTEM

CROSS-REFERENCE TO RELATED APPLICATIONS

This application claims priority under 35 U.S.C. §119(e) to U.S. Provisional Patent Application Ser. No. 60/943,483, OFFSET NULLING SYSTEM, filed on Jun. 12, 2007, the content of which is hereby incorporated by reference herein in its entirety for all purposes.

FIELD OF THE INVENTION

The present invention relates generally to offset correction in differential signaling systems. More particularly, but not exclusively, the invention relates to systems and methods of nulling offsets found in differential circuits.

BACKGROUND OF THE INVENTION

Differential signals find widespread use due to their ability to reject common mode noise and to maximize signal range. This is because the transmitted information is represented by the difference between two signals. The maximum signal value is typically limited by voltage supply and circuit structure. The minimum is practically set by noise and offsets.

Many systems require a wide dynamic range to operate properly. Some systems must minimize offsets to avoid problems. For example, offsets in radio transmitters typically cause carrier leakage that degrades performance. Measuring and correcting these offsets is particularly challenging. It would therefore be advantageous to be able to null or zero differential offsets.

SUMMARY

The present invention relates generally to systems and methods for nulling offsets found in differential signals.

In one embodiment the present invention relates to an apparatus and method for nulling offsets associated with differential signals using a servo feedback loop to measure the offset and then generating a correction signal to be added to one or both of the differential signals to minimize the offset.

In one embodiment the present invention relates to an apparatus comprising a first circuit configured to sense an offset between a first differential current and a second differential current in a differential signaling pair, and a second circuit configured to generate an adjustment current based upon the offset between the first differential current and the second differential current. The adjustment current may be added to either one or both of the differential signals to correct the offset.

In another embodiment the present invention relates to a method for decreasing offsets between currents in a differential signaling system including a differential signaling pair, the method including generating a sense signal based on a first differential current and a second differential current, generating an adjustment current based on the sense signal, and combining the adjustment current with one or both differential currents to decrease the offset.

In another aspect the present invention relates to a method of adjusting an offset in a differential signaling system, the method including setting an SAR output to an initial value, generating a correction signal based on the SAR output, combining the correction signal with a first differential current in a differential signaling pair to generate an adjusted first differential current, comparing the adjusted first differential current to a second differential current in the differential signaling pair, and repeating the process until the adjusted first differential current and the second differential current match within a desired tolerance.

In another aspect the present invention relates to a method of adjusting an offset in a differential signaling system, the method including setting a SAR output to an initial value, generating a correction signal based on the SAR output, combining the correction signal with a first differential current in a differential signaling pair to generate an adjusted first differential current, combining the correction signal with a second differential current in the differential signaling pair to generate an adjusted second differential current, comparing the adjusted first differential current to the adjusted second differential current, and repeating the process until the adjusted first differential current and the adjusted second differential current match within a desired tolerance.

Additional aspects of the present invention are described below in conjunction with the drawings.

BRIEF DESCRIPTION OF THE DRAWINGS

The foregoing aspects and the attendant advantages of the embodiments described herein will become more readily apparent by reference to the following detailed description when taken in conjunction with the accompanying drawings wherein.

DETAILED DESCRIPTION

Figure 1:
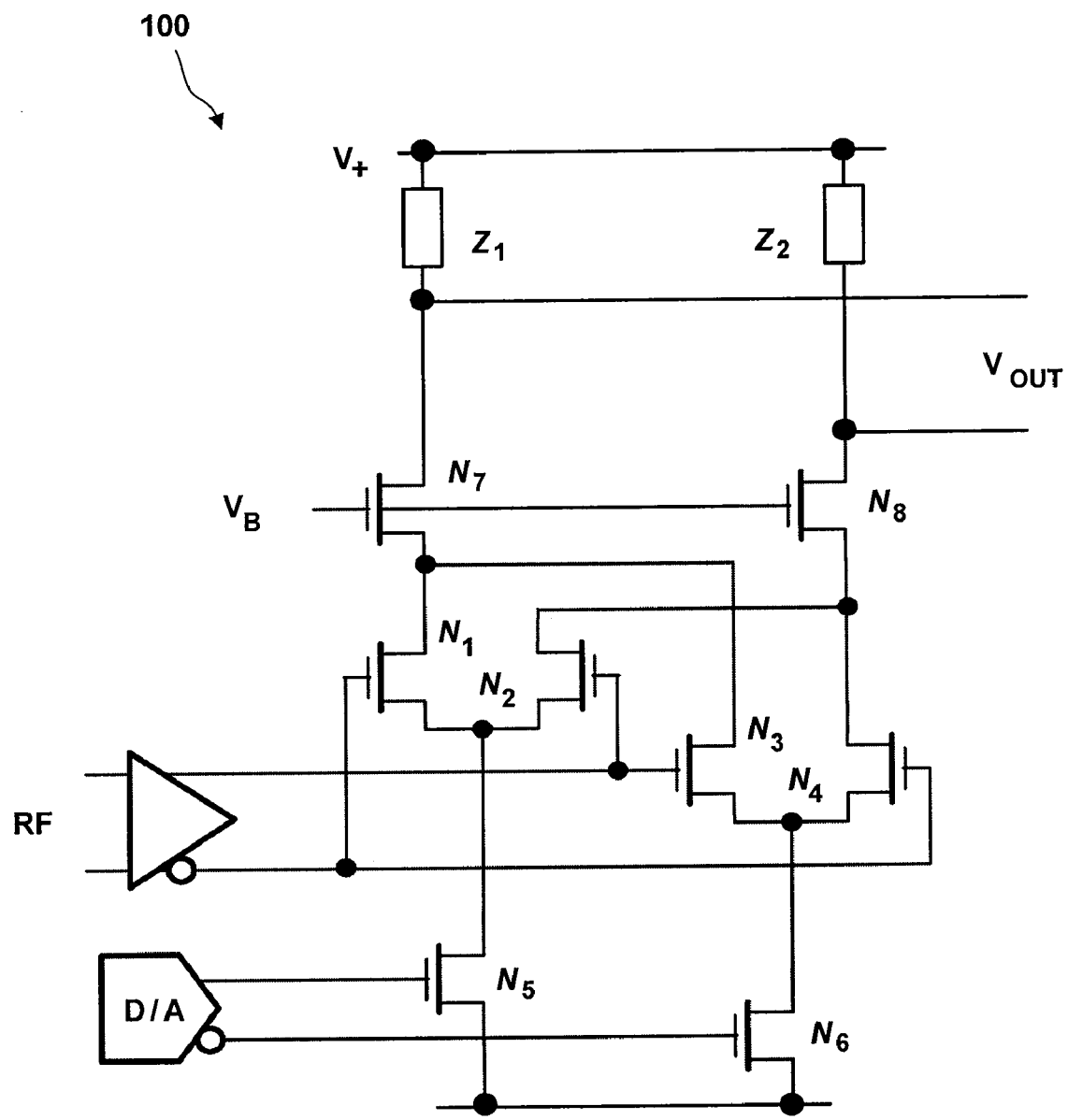
FIG. 1 shows a simple mixer or analog multiplier.

A simple mixer or analog multiplier circuit 100 is shown in FIG. 1. It may be used in in-phase and quadrature (I/Q) upconverters to translate a baseband signal to a 10 radio frequency (RF) carrier. It may also be used in polar transmitters to control the envelope of a phase-modulated RF signal. The baseband signal is translated to analog currents by a digital to analog (D/A) converter along with using devices $N_5$ and $N_6$. These currents may then be commutated by RF signal driving transistor pairs $N_1$-$N_2$ and $N_3$-$N_4$. Cascode transistors $N_7$ and $N_8$ isolate the load.

The mixer is described mathematically by the equation $$s(t)=m(t)\cos(\omega_c t)$$

where m(t) is an information signal represented by analog currents and $\omega_c$ is the frequency of the RF carrier driving the commutating devices. If m(t) also includes a direct current (DC) offset, then $$s(t)=[m(t)+dc]\cos(\omega_c t)=m(t)\cos(\omega_c t)+dc\cdot\cos(\omega_c t)$$

Figure 2A:
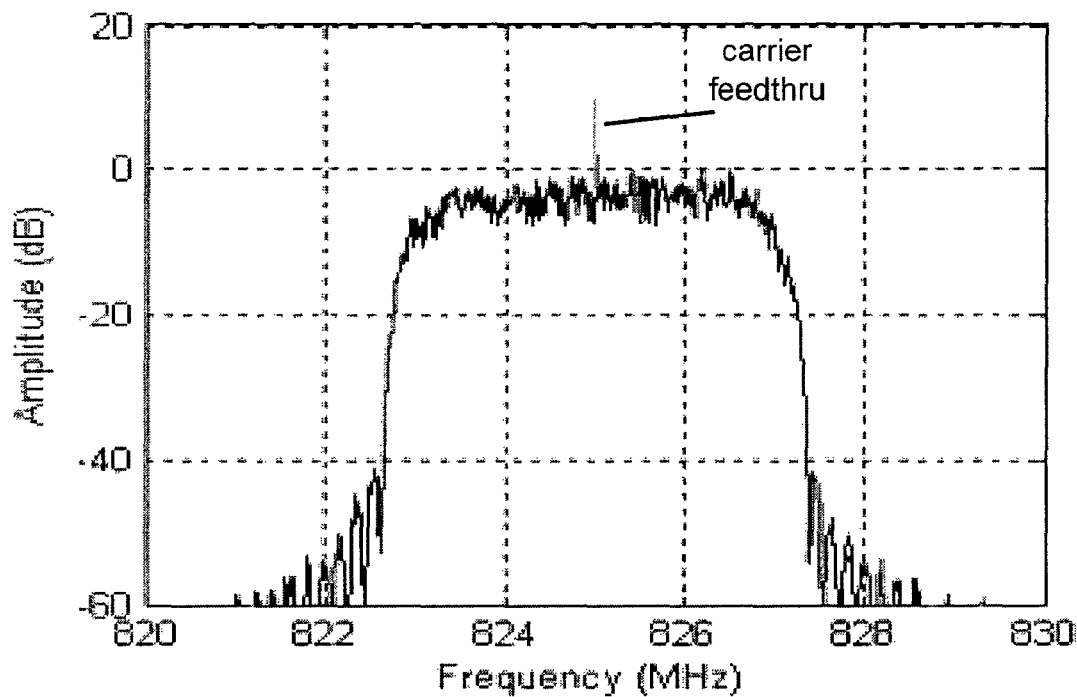
FIG. 2a shows the output spectrum of a mixer subjected to an offset.

The second term is the RF carrier feedthrough illustrated in FIG. 2a.

Figure 2B:
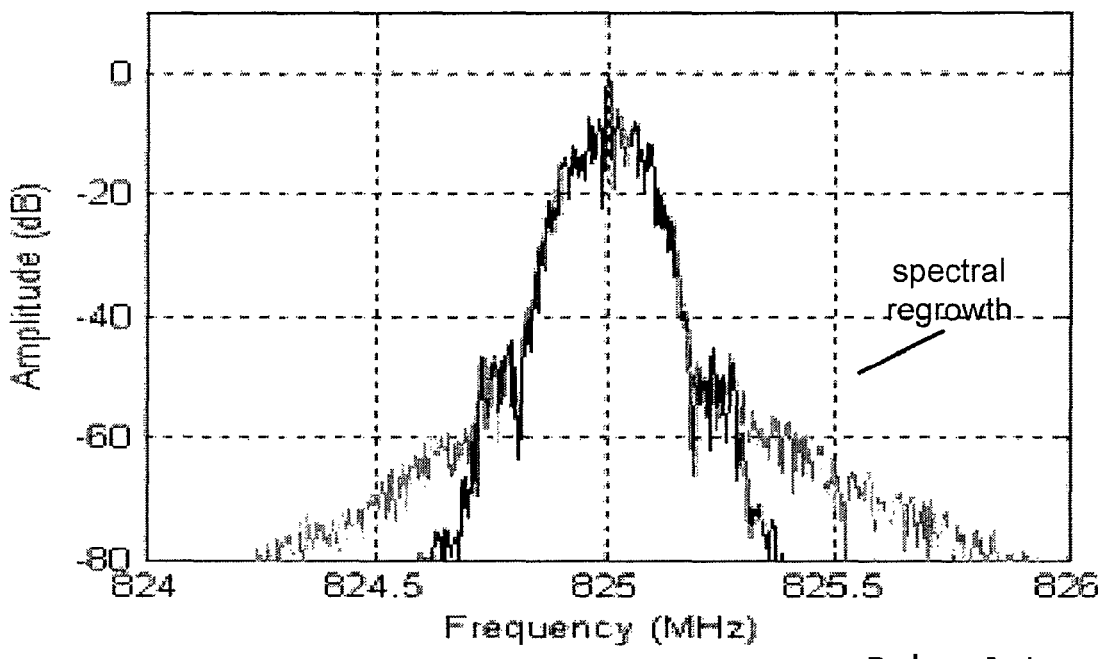
FIG. 2b shows an analog multiplier with an offset added to the AM signal.

In a polar transmitter, the mixer more appropriately resembles an analog multiplier. In this case, $$s(t) = AM(t)\cos[\omega_c t + \phi_M(t)]$$

where AM(t) is the envelope and $\phi_m(t)$ is the phase of the complex information signal. Since the phase-modulation spreads the RF carrier, the signal leakage due to a dc offset appears differently as shown in FIG. 2b, but still presents a problem since it degrades spectral emissions.

Figure 3A:
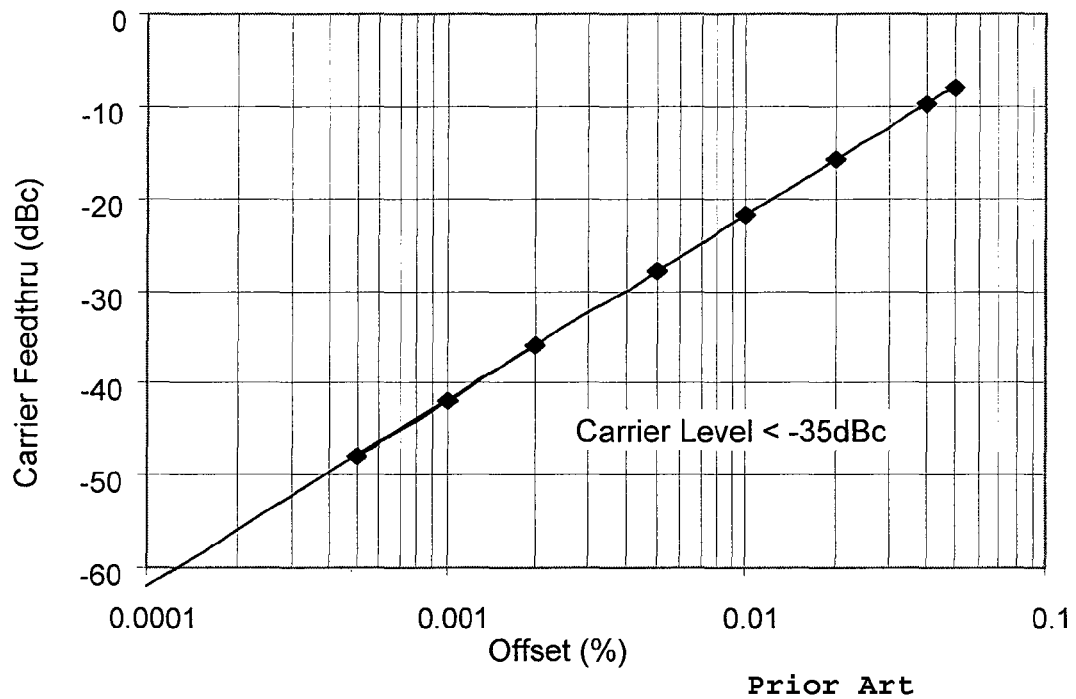
FIG. 3a illustrates the relationship between carrier leakage and offset level.
Figure 3B:
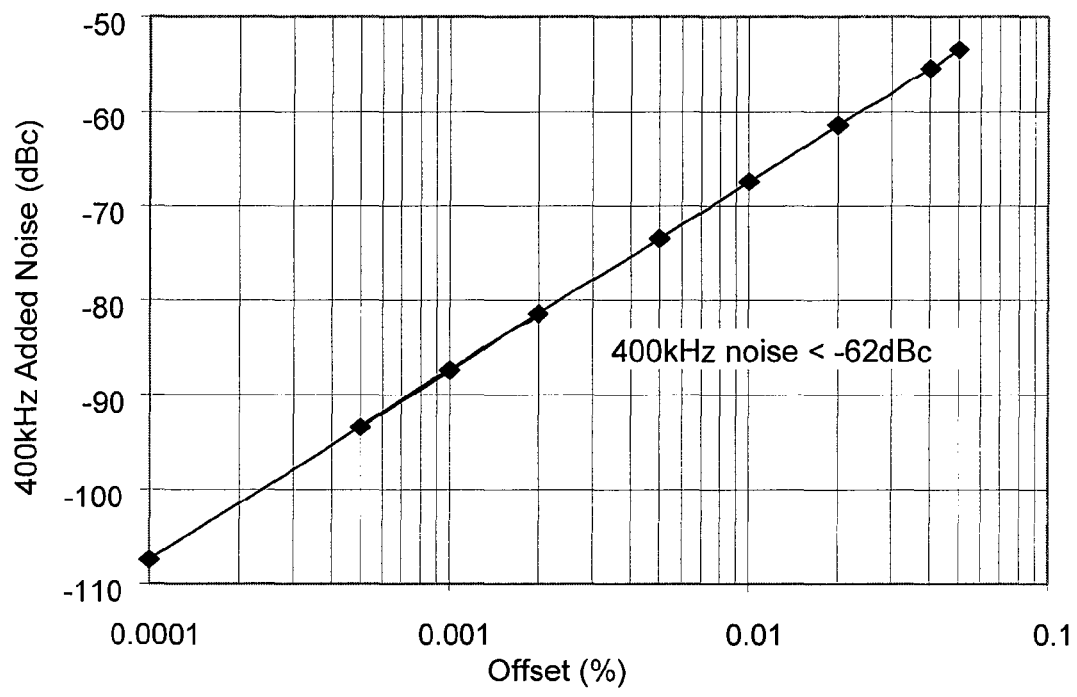
FIG. 3b illustrates the emission levels at 400 kHz as a function of offset added to an EDGE signal.

In many applications it is desirable to minimize the dc term in both the I/Q modulator and the polar transmitter. FIG. 3a shows the relationship between offset and carrier leakage in the mixer. FIG. 3b shows the effect of offset on an EDGE polar transmitter at 400 kHz away from the RF carrier.

Figure 4:
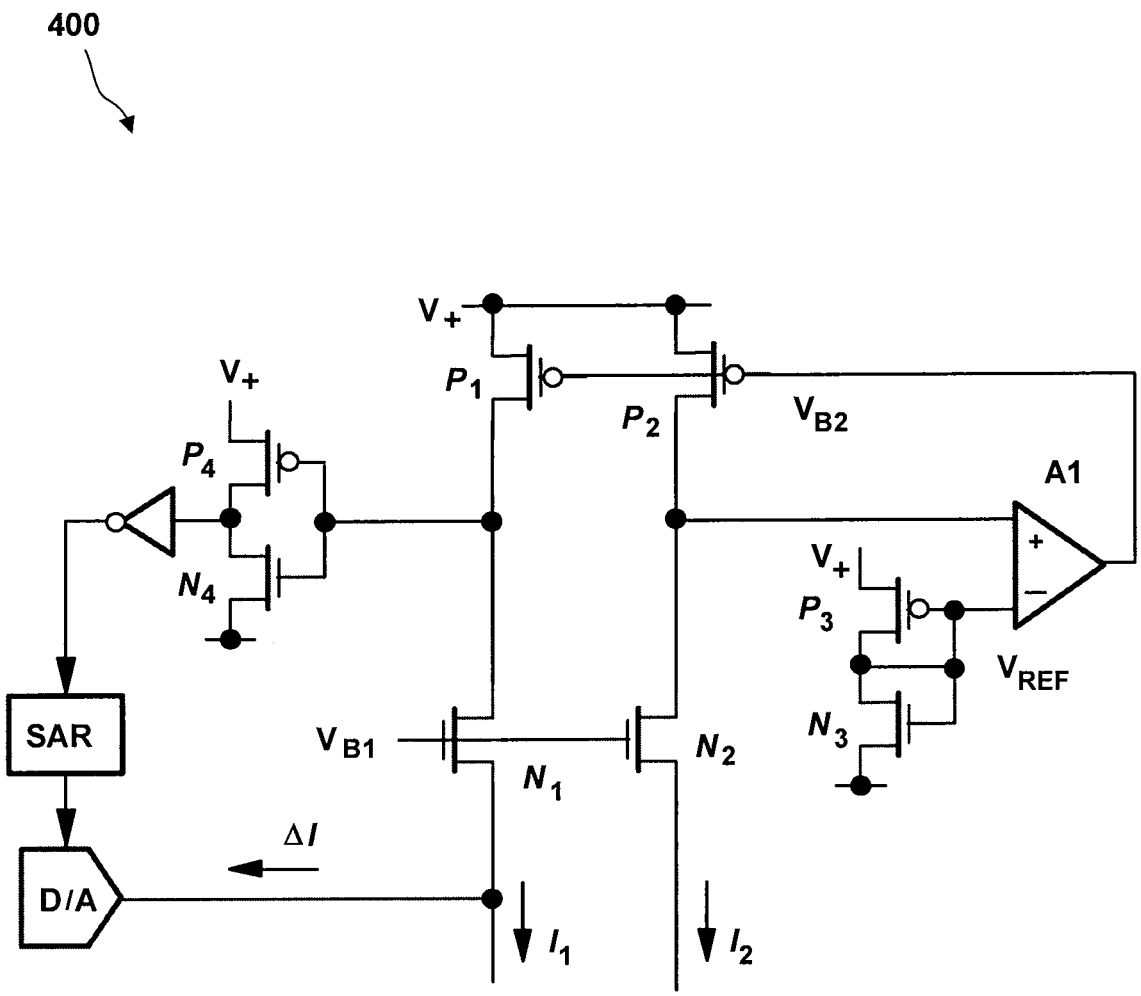
FIG. 4 illustrates one embodiment of a nulling circuit in accordance with aspects of the present invention.

In practice, the offset typically needs to be less than −35 dBc for an I/Q modulator and −55 dBc for a polar transmitter. Since the offset can vary with circuit design and processing, it becomes necessary to null this parameter. FIG. 4 shows one embodiment of a circuit 400 configured to accomplish this. During a calibration stage, the analog currents $I_1$ and $I_2$ may be steered through transistors $N_1$ and $N_2$ biased by voltage $V_{B1}$. Ideally, these currents match when m(t) and AM(t) equal zero. A servo loop may be used to establish the bias voltage $V_{B2}$ for transistors $P_1$ and $P_2$, which are matched. It may use an amplifier A1 to drive its non-inverting input to be equal to the reference voltage $V_{REF}$. Since transistors $P_1$-$P_2$ are matched, the voltage at the drain of $P_1$ indicates whether analog current $I_1$ is larger or smaller than analog current $I_2$. A successive approximation algorithm may be used to force the current difference, $$\Delta I = I_2 - I_1$$

to within the resolution of the D/A converter.

Transistors $N_3$-$P_3$ are configured as a replica of inverter $N_4$-$P_4$ and are used to set the voltage reference $V_{REF}$ equal to the inverter's threshold. This drives the servo loop to force the drain of transistor $P_2$ equal to the inverter's threshold. By matching transistors $P_1$ and $P_2$, the drain of $P_i$ ideally equals the inverter's threshold when $I_{D1}$ equals $I_{D2}$. This is true regardless of the magnitude of $I_{D1}$ and $I_{D2}$. In practice, matching issues as well as the input-referred offset of amplifier A1 may produce a small but tolerable error.

The analog currents of FIG. 1 may be steered into the nulling circuit a number of different ways. In one embodiment, the bias applied to the cascode transistors $N_7$-$N_8$ can be connected to ground with currents $I_1$-$I_2$ drawn from either the source terminals of these transistors or the drain terminals of transistors $N_5$-$N_6$. Alternatively, in another embodiment the RF signal applied to transistors $N_1$-$N_4$ can be forced low while tapping into the outputs of devices $N_5$-$N_6$. This permits a mixer structure without the cascode devices.

Figure 5:
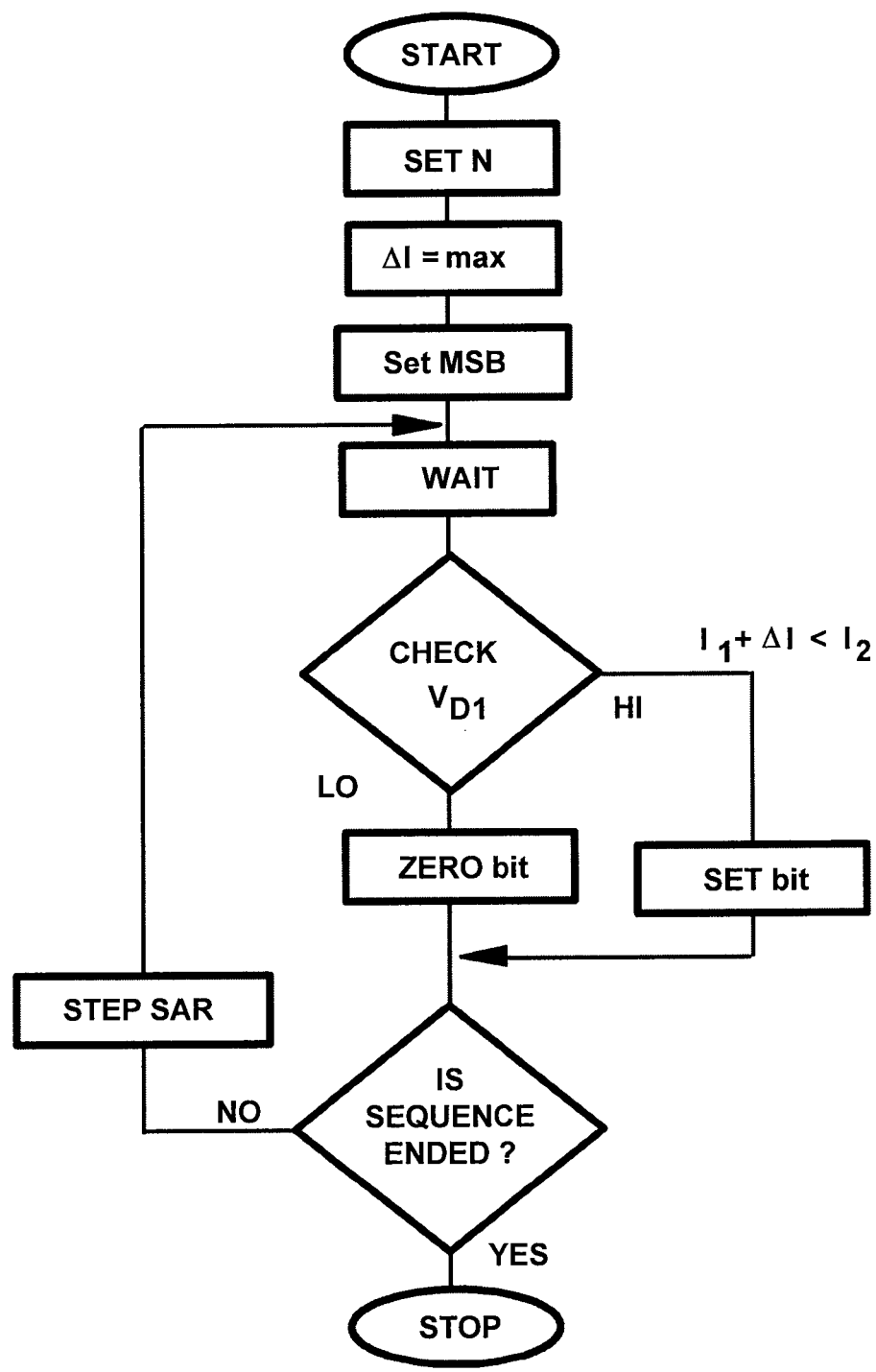
FIG. 5 illustrates one embodiment of a successive approximation algorithm used to adjust a nulling circuit as is shown in FIG. 4 in accordance with aspects of the present invention.

The successive approximation algorithm shown in FIG. 5 determines the proper offset adjustment. The algorithm starts by resetting the register to all logic LO values, which directs the D/A converter to source current $\Delta I$. This corresponds to the lowest value for $I_1 + \Delta I$, forcing the drain of $P_1$ towards the supply voltage. The result signals the SAR logic that the register value needs to increase. The most significant bit (MSB) of the register is tested first. It's set to logic HI and drives the D/A converter to change current $I_1 + \Delta I$. This feeds transistor $P_1$ and in turn drives the inverters that interface to the successive approximation register. The SAR logic uses the result to again determine if $I_1 + \Delta I$ is larger or smaller than $I_2$. If $I_1 + \Delta I$ is larger, then the MSB is reset. Otherwise, the MSB is locked at logic HI. Each successive bit is tested in a similar fashion working from the MSB to the least significant bit (LSB). Once complete, the register and D/A converter supply the current $\Delta I$ that nulls the offset.

Embodiments of such a nulling circuit and successive approximation algorithm may be used to null the offset common to differential signals as needed in a variety of applications.

Figure 6:
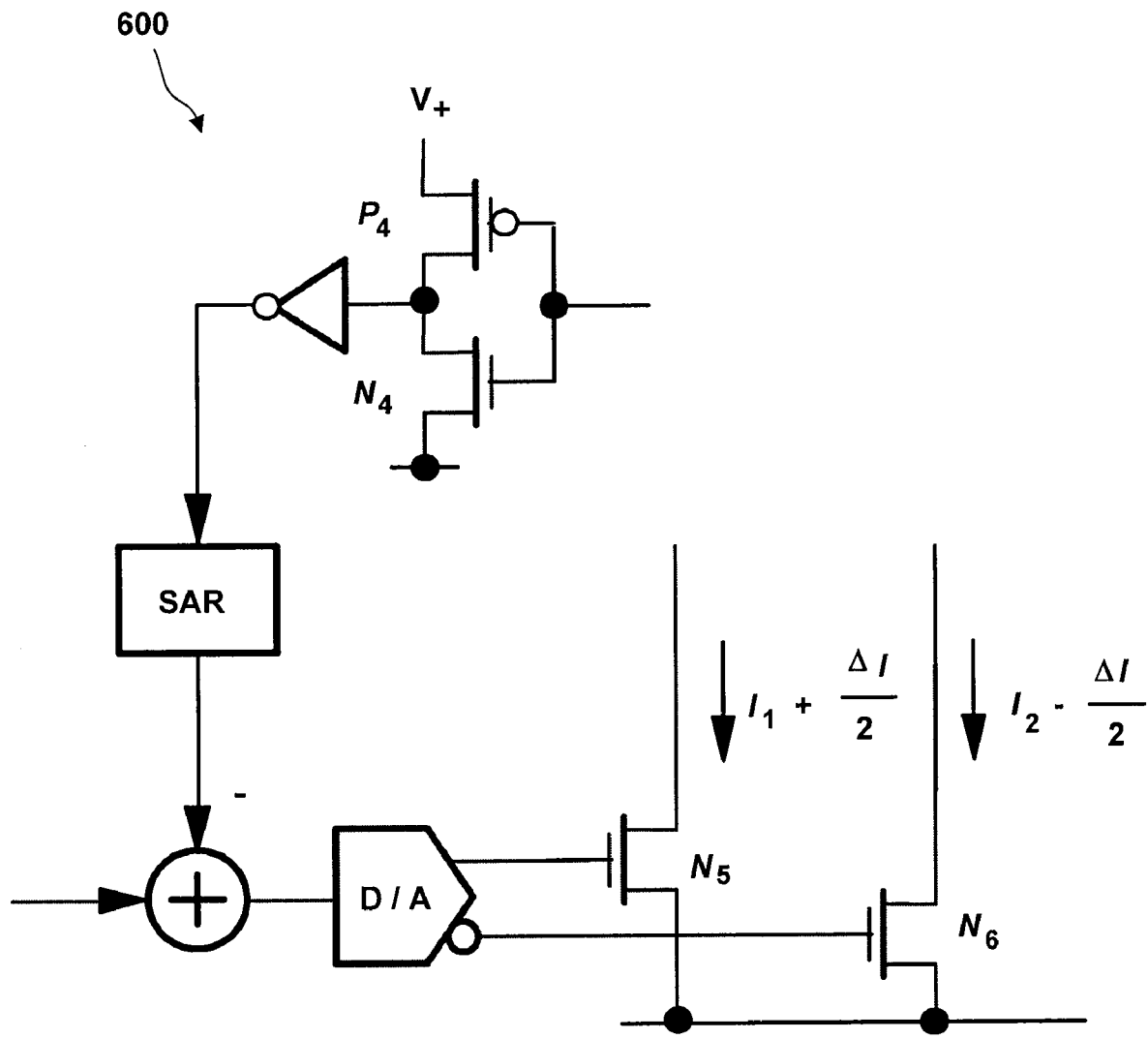
FIG. 6 illustrates another embodiment of a nulling circuit that uses digital methods in accordance with aspects of the present invention.

In an alternative embodiment 600, the successive approximation register directly offsets the input signal as shown in FIG. 6. This may be readily accomplished using simple digital logic. Here, the adjustment current $\Delta I$ affects both currents $I_1$ and $I_2$.

The foregoing description, for purposes of explanation, used specific nomenclature to provide a thorough understanding of the invention. However, it will be apparent to one skilled in the art that the specific details are not required in order to practice the invention. Thus, the foregoing descriptions of specific embodiments of the present invention are presented for purposes of illustration and description. They are not intended to be exhaustive or to limit the invention to the precise forms disclosed; obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. It is intended that the following claims and their equivalents define the scope of the invention.

What is claimed is:

1. An apparatus for decreasing offsets between currents in a differential signaling system, the circuit comprising:
   a first circuit configured to sense an offset between a first differential current signal and a second differential current signal; said first differential current signal and said second differential current signal comprising a differential signaling pair;
   a second circuit configured to generate an adjustment current signal based upon the offset between the first differential current signal and the second differential current signal; wherein the adjustment current signal is generated to decrease the offset between the first differential current signal and the second differential current signal by being combined with the first differential current signal;
   a matched transistor pair including a first sense transistor and a second sense transistor;
   a first inverter circuit coupled to the drain of the first sense transistor; and
   a bias circuit coupled to the drain of the second sense transistor, the bias circuit configured to bias the first and second sense transistors such that the drain voltage of the second sense transistor matches the threshold of the first inverter.

2. The apparatus of claim 1 wherein the first inverter circuit comprises a first pair of complementary transistors and the bias circuit comprises a matched second pair of complementary transistors.

3. The apparatus of claim 2 wherein the bias circuit further comprises:
   an amplifier circuit; wherein the second pair of complementary transistors is configured to generate an output matching the threshold of the first inverter circuit, and wherein the output of the matched second pair of complementary transistors and the drain of the second transistor are coupled to the inputs of the amplifier circuit, and the output of the amplifier circuit is coupled to the gates of the first and second sense transistors.

4. The apparatus of claim 1 further comprising a second inverter circuit coupled to the output of the first inverter circuit.

5. The apparatus of claim 1 wherein the second circuit comprises:
   a successive approximation register (SAR) coupled to the first circuit; and
   a digital to analog (D/A) converter coupled to the SAR output and the first differential current signal, wherein the D/A converter is configured to generate the adjustment current signal based on an output signal provided by the SAR.

6. A method for decreasing offsets between currents in a differential signaling system, the method comprising:
   generating a sense signal to sense an offset between a first differential current signal and a second differential current signal; said first differential current signal and said second differential current signal comprising a differential signaling pair;
   generating an adjustment current signal based upon the offset between the first differential current signal and the second differential current signal; and
   combining the adjustment current signal with the first differential current signal to decrease said offset;
   wherein the step of generating a sense signal comprises:
      generating a first voltage signal associated with the first differential current signal and a second voltage signal associated with the second differential current signal;
      comparing the first voltage signal with the second voltage signal; and
      generating, responsive to said comparing, the sense signal; and
   wherein the step of comparing the first voltage signal with the second voltage signal comprises:
      setting the second voltage signal to match the threshold of an inverter; and
      providing the first voltage signal to the input of the inverter;
   and wherein the step of generating, responsive to said comparing, the sense signal comprises:
      inverting the first voltage signal to generate an intermediate signal; and
      inverting the intermediate signal to generate the sense signal.

7. The method of claim 6 wherein the step of generating an adjustment current comprises:
   receiving the sense signal;
   adjusting a SAR output responsive to the sense signal; and
   generating the analog correction signal based on the SAR output.

8. The method of claim 7 wherein the step of combining said adjustment current with the differential signaling pair comprises combining the analog correction signal with the first differential current signal.

* * * * *